(12) United States Patent
Wu

(10) Patent No.: US 6,998,694 B2
(45) Date of Patent: Feb. 14, 2006

(54) HIGH SWITCHING SPEED TWO MASK SCHOTTKY DIODE WITH HIGH FIELD BREAKDOWN

(75) Inventor: Shye-Lin Wu, No.10, Alley 53, Lane 454, Chen Kung Road, Hu Kuo Hsiang, Hsinchu Hsien (TW)

(73) Assignees: Shye-Lin Wu, Hsinchu Hsien (TW); Chip Integration Tech. Co., Ltd., Hsin-Chu (TW)

( * ) Notice: Subject to any disclaimer, the term of this patent is extended or adjusted under 35 U.S.C. 154(b) by 0 days.

(21) Appl. No.: 10/633,500

(22) Filed: Aug. 5, 2003

(65) Prior Publication Data

US 2005/0029614 A1    Feb. 10, 2005

(51) Int. Cl.
*H01L 27/095* (2006.01)

(52) U.S. Cl. ........................ 257/471; 257/486
(58) Field of Classification Search ................ 257/155, 257/449–454, 471–486
See application file for complete search history.

(56) References Cited

U.S. PATENT DOCUMENTS

| | | | | |
|---|---|---|---|---|
| 3,668,481 A | * | 6/1972 | Saltich et al. | 257/481 |
| 3,956,527 A | * | 5/1976 | Magdo et al. | 438/405 |
| 4,315,782 A | * | 2/1982 | Tarng | 438/310 |
| 4,862,244 A | * | 8/1989 | Yamagishi | 257/484 |
| 4,982,260 A | * | 1/1991 | Chang et al. | 257/656 |
| 5,082,795 A | * | 1/1992 | Temple | 438/138 |
| 5,323,053 A | * | 6/1994 | Luryi et al. | 257/485 |
| 5,365,102 A | * | 11/1994 | Mehrotra et al. | 257/475 |
| 5,418,185 A | * | 5/1995 | Todd et al. | 438/384 |
| 5,888,891 A | * | 3/1999 | Gould | 438/575 |
| 5,998,833 A | * | 12/1999 | Baliga | 257/329 |
| 6,049,108 A | * | 4/2000 | Williams et al. | 257/341 |
| 6,096,629 A | * | 8/2000 | Tsai et al. | 438/570 |
| 6,252,288 B1 | * | 6/2001 | Chang | 257/471 |
| 6,351,018 B1 | * | 2/2002 | Sapp | 257/499 |
| 6,399,996 B1 | * | 6/2002 | Chang et al. | 257/484 |
| 6,404,033 B1 | * | 6/2002 | Chang et al. | 257/484 |

(Continued)

OTHER PUBLICATIONS

Hsu et al., "A Novel Trench Termination Design for 100-V TMBS Diode Application", Nov. 2001, IEEE Electron Device Letters, vol. 22, No. 11, pp. 551-552.*

(Continued)

*Primary Examiner*—Matthew Smith
*Assistant Examiner*—Lex H. Malsawma
(74) *Attorney, Agent, or Firm*—Troxell Law Office, PLLC

(57) ABSTRACT

A power Schottky rectifier device and its fabrication method are disclosed. The method comprises the following steps: First, a semiconductor substrate having a relatively heavily doped n+ doped layer and a lightly doped is provided. A buried p region is then formed in the epi layer by ion implantation. Afterward, a first oxide layer and a nitride layer are then successively formed on the epi layer. The result structure is then patterned to form trenches. Subsequently, a thermal oxidation step is performed to recover etch damage. A wet etch is then performed to remove the thin oxide layer in the trench to expose the silicon in the sidewall. After that, a silicidation process is then performed to form silicide layer on the n-epi-layer in the trenches. After a removal of un-reacted metal layer, a top metal layer is then formed on the silicide layer and on the first oxide layer or nitride layer. The top metal layer on the termination region portion is then patterned to define anode. Finally, after backside layers formed on the rear surface of the substrate are removed, another cathode layer is formed on the rear surface.

10 Claims, 4 Drawing Sheets

U.S. PATENT DOCUMENTS 6,426,541 B1 * 7/2002 Chang et al. ............... 257/472
6,448,160 B1 * 9/2002 Chang et al. ............... 438/527
6,621,107 B1 * 9/2003 Blanchard et al. .......... 257/155
6,656,843 B1 * 12/2003 Bol ............................ 438/694
6,686,614 B1 * 2/2004 Tihanyi ....................... 257/155
6,740,951 B1 * 5/2004 Tsui et al. ................... 257/483
6,855,593 B1 * 2/2005 Andoh et al. ............... 438/237

2003/0057482 A1 * 3/2003 Harada ....................... 257/329
2003/0151086 A1 * 8/2003 Ueno et al. ................. 257/324

OTHER PUBLICATIONS

IBM Technical Disclosure Bulletin, Feb. 1978, pp. 3486-3487.*

* cited by examiner

HIGH SWITCHING SPEED TWO MASK SCHOTTKY DIODE WITH HIGH FIELD BREAKDOWN

FIELD OF THE INVENTION

The present invention relates to a semiconductor process, specifically, to a novel termination structure for trench MOS devices so as to prevent leakage current.

BACKGROUND OF THE INVENTION

Schottky diode is an important power device and used extensively as output rectifiers in switching-mode power supplies and in other high-speed power switching applications, such as motor drives, switching of communication device, industry automation and electronic automation and so on. The power devices are usually required characteristics of carrying a large forward current, withstanding a high reverse voltage and minimizing the reverse leakage current.

A number of power rectifiers have been used to provide high current and reverse blocking characteristics. Hsu et al disclosed a Schottky rectifier structure in IEEE ELECTRON DEVICE LETTERS, vol. 22, No. 11, p.531 (2001); "A Novel Trench Termination Design For 100_V TMBS Diode Application." As is shown in FIG. 1A, the structure includes a plurality of trench type MOS gates 30 and a termination trench 25 formed into n-epi layer 20, which is formed on an n+ substrate 10. The termination trench 25 has spacer-like MOS gates 35 formed on the sidewall of the termination trench 25. A patterned insulating layer such as TEOS 40 is then formed on the termination trench 25. The spacer-like MOS gates 35 are almost covered by the TEOS layer 40 except a contact 36, which is adjacent to the active region. A patterned metal layer 50 act as anode electrode is then formed on the active region to contact the trench type MOS gates 30 and mesas 31 and the contact 36 of the spacer like MOS gate 35.

The Schottky rectifier structure of Hsu disclosed is design for high voltage and is capable of achieving an aim of a reverse blocking voltage over 100 V with only an extreme low leakage current. However, the processes require at least three photo masks: one is for trenches defined, the second is for TEOS defined, and the third is for metal extension in the termination region. Thus, an object of the present method is to simplify the processes. According to the present invention, only two photo masks are needed to implement high performance Schottky rectifier diode.

Chang discloses another conventional method in U.S. Pat. No. 6,252,288. The structure shown in FIG. 1B includes a plurality of trenches 60 recessed into n-epi layer 52 that is formed on the n+ substrate 54. Each of the trenches 60 is formed with an oxide liner 64 on the sidewall and a p+ doping region 66 at the bottom of the trenches 60. The trenches 60 are then refilled with a polysilicon layer 62. A Schottky barrier metal layer 56 served as an anode is then formed and patterned on the resulted surface of the substrate. Finally, another metal layer 158 served as cathode is formed on the backside surface of the substrate opposite to the anode. The area from the midpoint of one trench structure to the midpoint of an adjacent trench structure is referred to as a "cell."

An object of the present invention is to propose a high switching speed two mask Schottky diode with high field breakdown and a method making the same.

SUMMARY OF THE INVENTION

The present invention discloses a power Schottky rectifier device and its fabrication method. The method comprises the following steps: First, a semiconductor substrate having a relatively heavily doped n+ doped layer and a lightly doped n-epi-layer is provided. An ion implantation process is then performed to implant boron or $BF_2^+$ ions into the n-epi layer to form a buried region. Afterward, a first oxide layer and a nitride layer are then successively formed on the n-epi layer. Then, the first masking step is used to define the active region by dry etching the nitride layer and the first oxide layer and the silicon substrate form trenches, which have a depth ranging from 1 to 5 $\mu$m measured from the surface of the epi layer.

Subsequently, a thermal oxidation process is performed to grow the second oxide layer within trenches to recover the etching damage and to smooth the surface of trench region. After removing the second oxide layer in the trench region, a barrier metal layer (e.g. Ti, Ta, Pd, Ni, Cr, Mo, Pt, Zr, Y, V, etc.) is then deposited on the entire surface. A thermal annealing process is then performed to form the silicide layer. The un-reacted metal layer is then removed by etching. A top metal layer (e.g., TiNi/Ag or Al, or TiW/Al) is then formed on the silicide layer and on the first oxide layer and nitride layer. The top metal layer on the termination region is then patterned to define anode. After backside layers formed on the rear surface of the substrate are removed, another metal layer (e.g., TiNi/Ag) is formed on the rear surface of the substrate to form cathode layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The preferred embodiment is to illustrate the method of forming termination structure and the Schottky diode simultaneously.

Figure 1A:
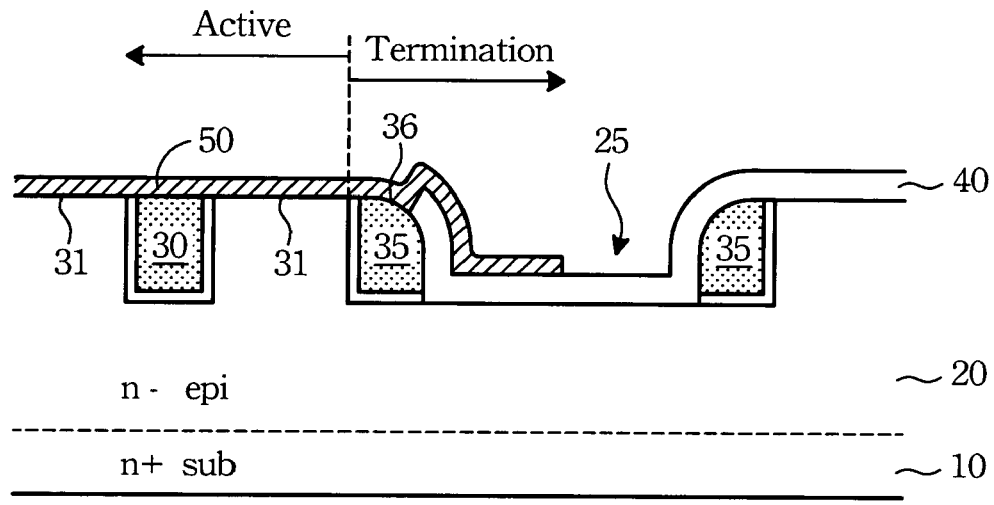
FIG. 1A and FIG. 1B shows the prior art trench Schottky diode devices with a trench termination structure.
Figure 1B:
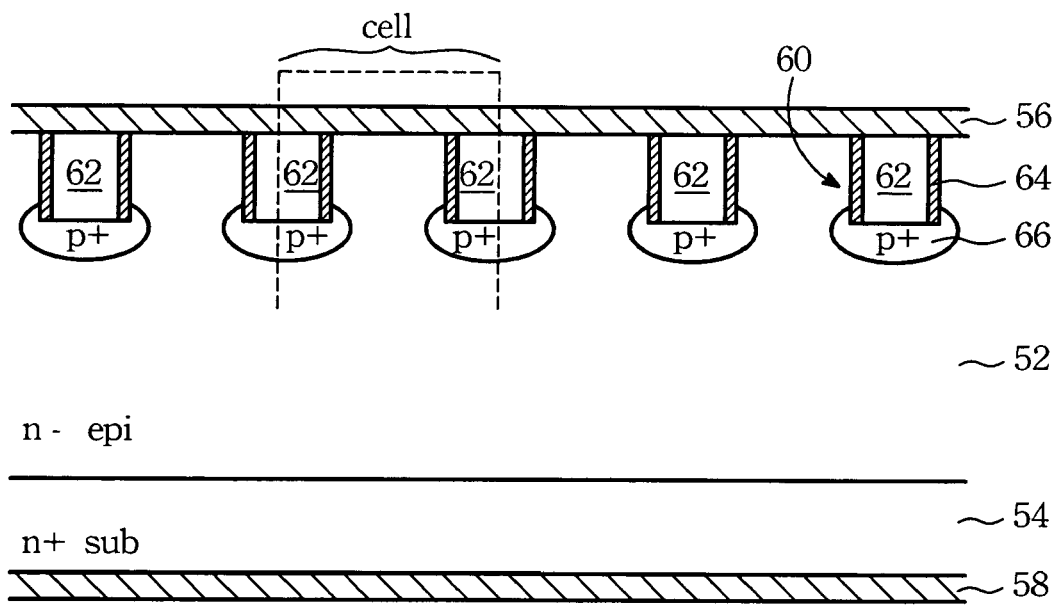
Figure 2:
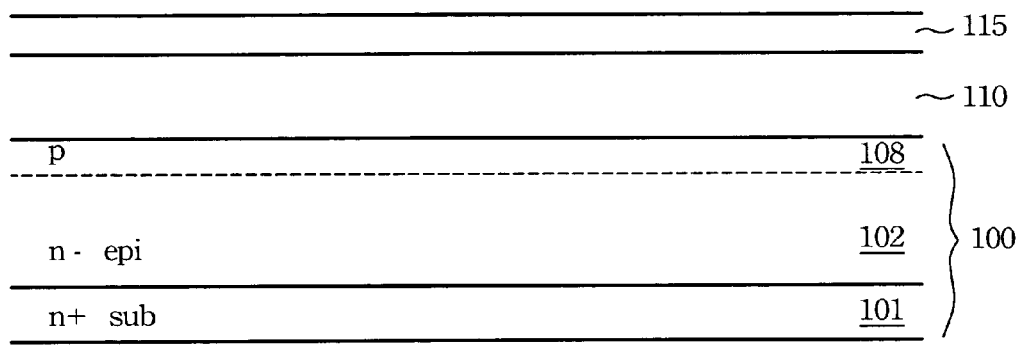
FIG. 2 is a cross-sectional view of forming an oxide layer on a p layer on the n-epi-layer on an n+ semiconductor substrate in accordance with the present invention.

Referring to FIG. 2, a cross-sectional view shows a semiconductor substrate 100 having a relatively heavily doped n+ doped layer 101 and a lightly doped n-epi-layer 102 provided.

An ion implant is then performed to implant boron or $BF_2^+$ ions to form a buried region 108 in the n-epi layer 102 by using a dosage and energy, respectively, between about 1E10–1E16 $cm^{-2}$ and 10–300 keV. Thereafter, a first oxide layer 110 between about 100 nm to 1000 nm is formed by a thermal oxidation process. The nitride layer 115 is then formed by low pressure chemical vapor deposition (LPCVD) to about 50–300 nm. Worthwhile, forgoing ion implant step can also be performed after the first oxide layer 110 formation.

Figure 3:
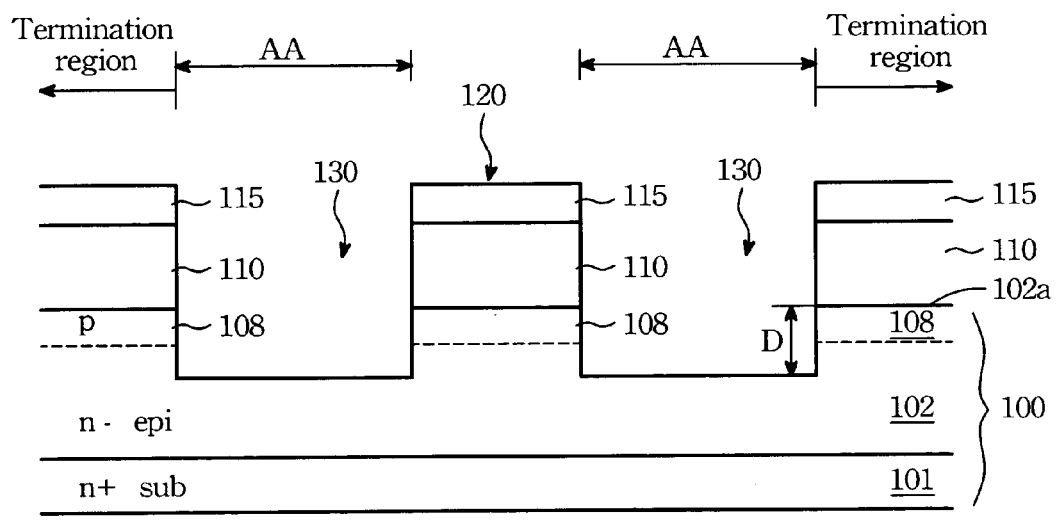
FIG. 3 is a cross-sectional view of patterning nitride layer and first oxide layer and then using the patterned nitride layer and first oxide layer recessing the n-epi layer in accordance with the present invention.
Figure 4:
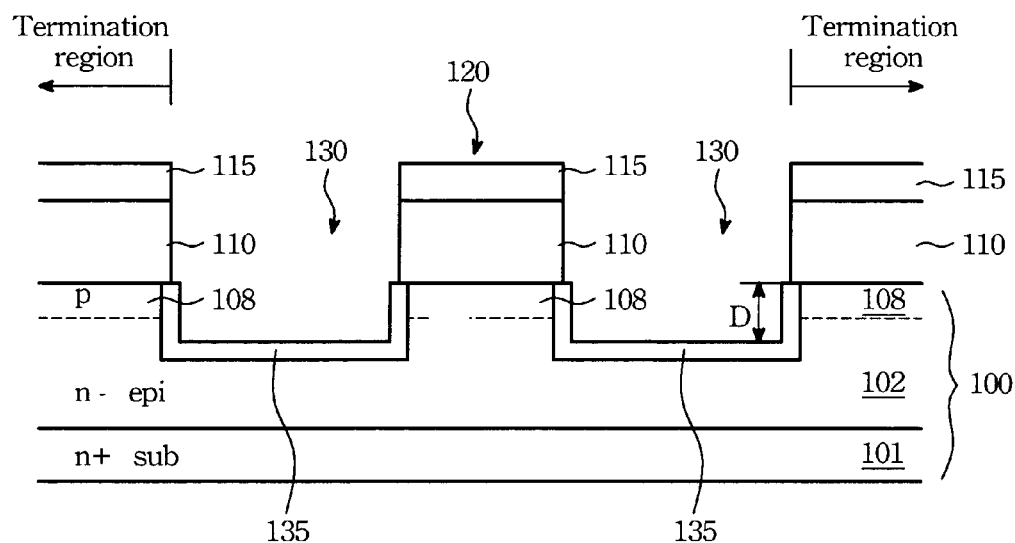
FIG. 4 is a cross-sectional view of performing a thermal oxidation to recover etching damage in accordance with the present invention.

Referring to FIG. 3 to define active regions (AA), and termination region, a photoresist pattern (not shown) through lithographic patterning is then formed on the nitride layer 115 or on the first oxide layer 110 to define trenches 130 separated each other by a field mesas 120. Next, for the case of photoresist pattern (not shown) formed on the nitride layer 115, a dry etch is then performed to pattern the nitride layer 115 and the first oxide layer 110. After a removal of the photoresist pattern, a dry etch continue which recesses the substrate 100 to form a plurality of trenches 130 by using the patterned nitride layer 115 and the first oxide layer 110 as a mask. In a preferred embodiment, the trench 130 depth D are between about 1–5 $\mu$m measured from the surface 102a of the n-epi layer 102. Worthwhile, the termination region is a mesa sits on the perimeter of the substrate 100, Referring to FIG. 4, which includes the nitride layer 115. A high temperature thermal oxidation at a temperature between about 950 to 1100° C. in dry oxygen ambient is carried out to grow thin sacrifice oxide layer 135 between about 50–100 nm in silicon by consuming silicon material of the n-epi-layer 102 on the sidewall and the bottom of the trenches 130. The step is to recover damage during etching. Next, a wet etch is performed to remove the thin sacrifice oxide layer 135 in the trenches 130.

Figure 5:
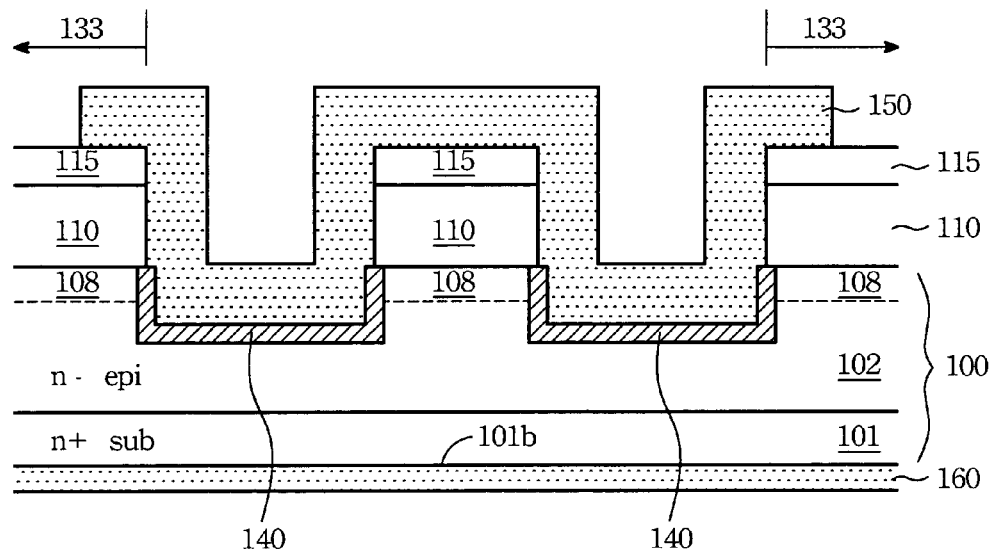
FIG. 5 is a cross-sectional view of forming silicide layer on n-epi layer of the trenches, forming and patterning a top metal layer on the front surface and forming a metal layer on the rear surface.

As is shown in FIG. 5, a Schottky barrier metal layer (not shown) then deposited on all areas. The material of the barrier metal, for instance, includes Ti, Ni, Cr, Pd, Pt, W Mo, Zr, V, etc. A thermal anneal at a temperature between about 400–1000° C. in nitrogen ambient is then performed to form a silicide layer 140 on the sidewall but not on the surface of the nitride layer 115 and first oxide layer 110.

The un-reacted metal layer on the dielectric layer (oxide and nitride layer) is then removed. Afterward, another thick top metal layer 150 is then formed on the entire areas. An exemplary candidate for the top metal layer is a TiNi/Ag layer (Ti, Ni co-deposited first, and then Ag followed) or a TiW/Al layer (Ti, W co-deposited first, and then Al followed). Afterward the top metal layer 150 is patterned to define anode. The top metal layer 150 covered the entire active region and extended to a portion of termination mesa region 133. Subsequently, a polishing process is performed firstly to remove all of the layers formed on the backside surface 101b of the substrate 100 during aforementioned process and then a backside metal layer 160 acted as cathode is formed thereafter by sputtering.

Figure 6A:
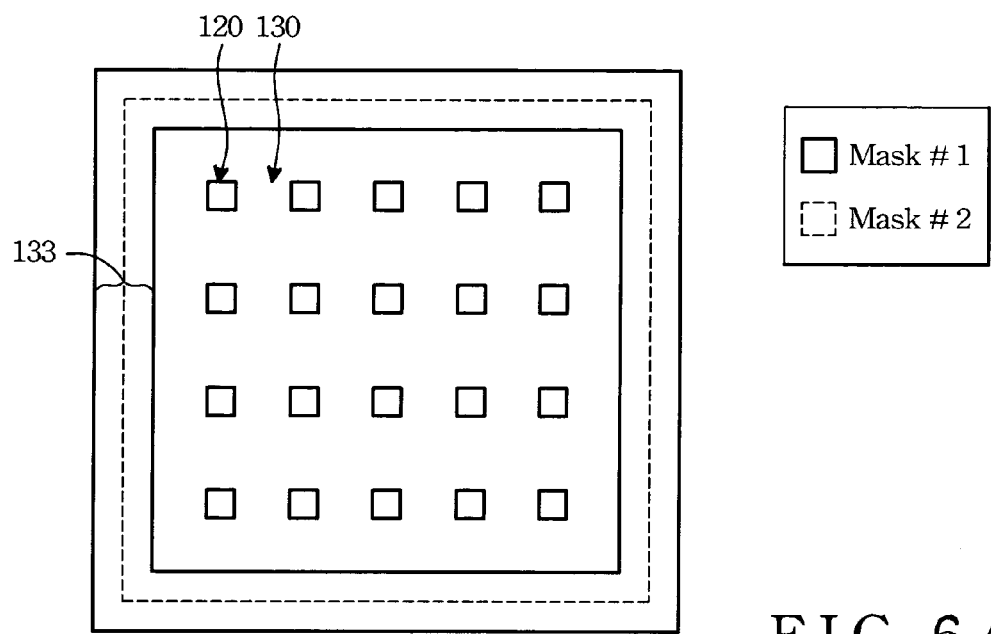
FIGS. 6A and 6B are a synoptic layout to show the trenches and the termination region; only two masks are used.
Figure 6B:
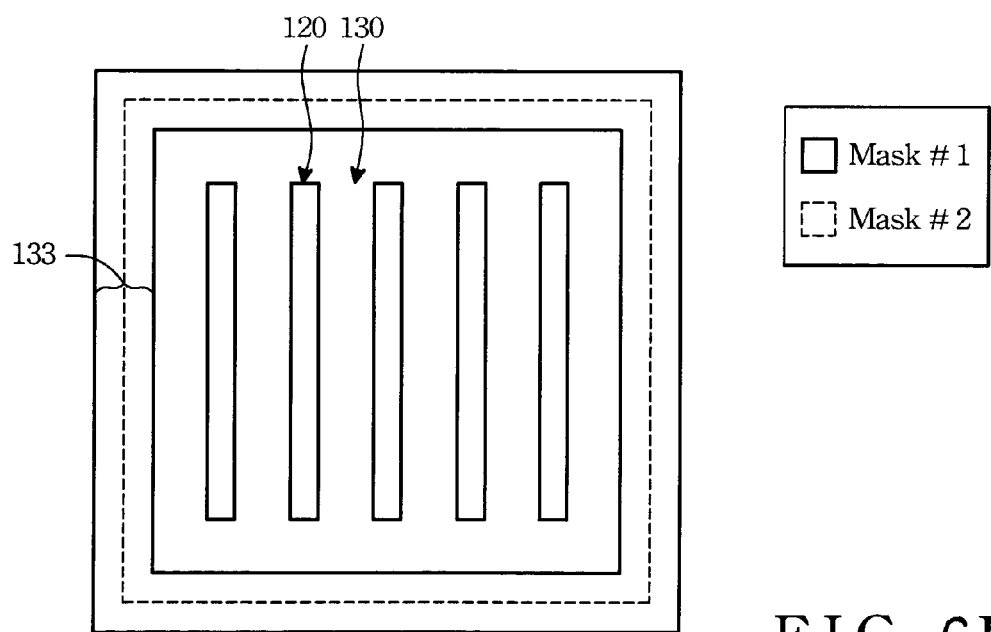

FIG. 6A shows a synoptic layout of the devices in accordance with the present invention. It shows more trenches, field mesas and termination mesa than from forgoing cross-sectional view. Other than the field mesa regions 120 distributed in a form of dots in a matrix, they can be distributed in a form of long strips in parallel, as is shown in FIG. 6B. Only two photo masks are required to form high performance Schottky barrier diode—one is to define the trench regions, the other one is to define the anode metal. The first oxide layer on the field mesas, however, can serves as a buffer layer for stress relief while bonding on the top surface.

The benefits of this invention are:
(1) Almost all of forward current are composed of majority carriers flowed through the trench. The minority current through mesa is rather rare. Thus, the device can provide fast switching speed.
(2) The guard ring, p region at the termination region is broad and extended and thus the bending region of the depletion boundary far away from the active region than the conventional device.
(3) The field mesas regions have thick dielectric layers (115/110) thereon, which are a flexible buffer layer. Thus, the mechanical stress due to bonding can be relief.
(4) The processes are simpler than that of conventional methods. The invention requires only two photo masks.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A power rectifier device, comprising:
 a semiconductor substrate having a first conductive layer doped with first-type impurities, an epi layer formed thereon which is extended to a first surface thereof and is lightly doped with said first-type impurities;
 a cathode metal layer formed on said first conductive layer opposite said first surface;
 a first oxide layer formed on said first surface;
 a nitride layer formed on said first oxide layer;
 a pair of trenches formed through said nitride layer and said first oxide layer and extending into a top portion of said epi-layer and spaced from each other by a first mesa region;
 a termination mesa region surrounding said pair of trenches;
 a second conductive type doped region formed into said epi layer of said first mesa region and said termination mesa region, wherein said first mesa region and said termination mesa region are regions located on said first surface having said first oxide layer formed thereon;
 a Schottky barrier silicide layer formed on said epi layer located on bottom and side surfaces of said trenches;
 a top metal layer acting as an anode and formed on said Schottky barrier silicide layer and extended to cover all surfaces of said first mesa region and a portion of said termination mesa region.

2. The power rectifier device according to claim 1, wherein said first oxide layer has a thickness between about 100–1000 nm and said nitride layer has a thickness between about 50–300 nm.

3. The power rectifier device according to claim 1, wherein said trenches have a depth of between about 1 to 5 $\mu$m measured from the surface of said epi layer.

4. The power rectifier device according to claim 1 wherein said Schottky barrier silicide layer is formed of metal silicide selected from the group consisting of silicide of Ti, Ni, Cr, Mo, Pt, Zr, and W with silicon.

5. The power rectifier device according to claim 1 wherein said top metal layer is formed of stacked layers of TiNi/Ag or TiW/Al.

6. A power rectifier device, comprising:
 a semiconductor substrate having a first conductive layer doped with first-type impurities, an epi layer formed thereon which is extended to a first surface thereof and is lightly doped with said first-type impurities;

a cathode metal layer formed on said first conductive layer opposite said first surface;

a first oxide layer formed on said first surface;

a nitride layer formed on said first oxide layer;

a pair of trenches formed through said nitride layer, and said first oxide layer and come into said epilayer and spaced from each other by a first mesa region;

a termination mesa region surrounding said pair of trenches;

a second conductive type doped region formed beneath all remnant portions of said first surface;

a Schottky barrier silicide layer formed on sidewalls of said epi layer portion and bottom of said trenches; and a top metal layer acting as an anode formed on said Schottky barrier suicide layer and extended to cover all surfaces of said first mesa region and a portion of said termination mesa region.

7. The power rectifier device according to claim 6, wherein said first oxide layer has a thickness between about 100–1000 nm and said nitride layer has a thickness between about 50–300 nm.

8. The power rectifier device according to claim 6, wherein said trenches have a depth of between about 1 to 5 mm measured from a surface of said epi layer.

9. The power rectifier device according to claim 6, wherein said Schottky barrier silicide layer is formed of metal silicide selected from the group consisting of silicide of Ti, Ni, Cr, Mo, Pt, Zr, and W with silicon.

10. The power rectifier device according to claim 6, wherein said top metal layer is formed of stacked layers of TiNi/Ag or TiW/Al.

* * * * *